(12) United States Patent
Lv et al.

(10) Patent No.: US 10,170,065 B2
(45) Date of Patent: Jan. 1, 2019

(54) SHIFT REGISTER UNIT AND DRIVING METHOD THEREOF, GATE DRIVING CIRCUIT, DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Lei Lv, Beijing (CN); Fei Xu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 259 days.

(21) Appl. No.: 14/904,910

(22) PCT Filed: Jul. 9, 2015

(86) PCT No.: PCT/CN2015/083662
§ 371 (c)(1),
(2) Date: Jan. 13, 2016

(87) PCT Pub. No.: WO2016/127561
PCT Pub. Date: Aug. 18, 2016

(65) Prior Publication Data
US 2016/0372069 A1    Dec. 22, 2016

(30) Foreign Application Priority Data
Feb. 15, 2015  (CN) .......................... 2015 1 0082323

(51) Int. Cl.
G11C 19/00    (2006.01)
G09G 3/36     (2006.01)
G11C 19/28    (2006.01)

(52) U.S. Cl.
CPC ............. *G09G 3/3677* (2013.01); *G09G 3/36* (2013.01); *G11C 19/28* (2013.01); *G09G 2300/0426* (2013.01); *G09G 2310/0286* (2013.01); *G09G 2310/08* (2013.01)

(58) Field of Classification Search
None
See application file for complete search history.

(56) References Cited

U.S. PATENT DOCUMENTS 7,406,146 B2 * 7/2008 Yu ................... G11C 19/28
                                                377/64
8,054,935 B2 * 11/2011 Tsai .................. G11C 19/184
                                                377/64

(Continued)

FOREIGN PATENT DOCUMENTS

CN    101868833    10/2010
CN    102654969    9/2012

(Continued)

OTHER PUBLICATIONS

Chinese Office Action with English Language Translation, dated Mar. 7, 2016, Chinese Application No. 201510082323.4.

(Continued)

*Primary Examiner* — Tuan T Lam
(74) *Attorney, Agent, or Firm* — Blakely Sokoloff Taylor & Zafman LLP

(57) ABSTRACT

The present invention discloses a shift register unit and driving method thereof, a gate driving circuit, and a display device, which relates to the field of display technology. The shift register unit comprises: an input module comprising a first input sub-module and a second input sub-module, an (Continued)

output control module and an output module. The first input sub-module transmits a signal inputted by a signal input terminal to a first node; the second input sub-module transmits a signal inputted by a low level signal input terminal to a second node based on the signal inputted by the signal input terminal; the output control module transmits a signal inputted by a clock signal input terminal to the second node based on the signal of the first node; the output module transmits a signal inputted by a high level signal input terminal to a signal output terminal based on the signal of the second node. The shift register unit and driving method thereof, the gate driving circuit, and the display device provided by the present invention are used for avoiding noise and distortion in signal output.

17 Claims, 5 Drawing Sheets

(56) References Cited

U.S. PATENT DOCUMENTS

| | | | |
|---|---|---|---|
| 8,537,094 B2 * | 9/2013 | Yang | G09G 3/3677 345/100 |
| 9,257,198 B2 * | 2/2016 | Yan | G09G 3/3611 |
| 9,324,270 B2 * | 4/2016 | Jeong | G09G 3/3266 |
| 9,508,450 B2 * | 11/2016 | Qing | G11C 19/184 |
| 2005/0185752 A1 | 8/2005 | Sasaki et al. | |
| 2008/0211797 A1 * | 9/2008 | Lee | G09G 3/3266 345/205 |
| 2011/0057926 A1 * | 3/2011 | Shang | G09G 3/3677 345/213 |
| 2014/0133621 A1 * | 5/2014 | Shang | G11C 19/28 377/67 |
| 2017/0039987 A1 * | 2/2017 | Yao | G09G 5/003 |

FOREIGN PATENT DOCUMENTS

| | | |
|---|---|---|
| CN | 102708925 | 10/2012 |
| CN | 103915074 | 7/2014 |
| CN | 104575438 | 4/2015 |

OTHER PUBLICATIONS

Office Action in Chinese Application No. 201510082323.4 dated Sep. 13, 2016, with English translation. 4 pages.
International Search Report and Written Opinion with English Language Translation, dated Nov. 2, 2015, Application No. PCT/CN2015/083662.

\* cited by examiner

SHIFT REGISTER UNIT AND DRIVING METHOD THEREOF, GATE DRIVING CIRCUIT, DISPLAY DEVICE

FIELD OF THE INVENTION

The present invention relates to the field of display technology, particularly to a shift register unit and a driving method thereof, a gate driving circuit, and a display device.

BACKGROUND OF THE INVENTION

The driving circuit of a thin film transistor liquid crystal display (TFT-LCD) consists of a gate driving circuit and a data driving circuit. Generally, the gate driving circuit opens a row of pixels firstly, the data driving circuit charges this row of pixels, then the gate driving circuit closes this row of pixels and opens a next row of pixels, the data driving circuit charges the opened next row of pixels again. Each row of pixels is charged successively so as to realize display of the whole TFT-LCD.

At present, there is an existing shift register, its circuit structure is as shown in FIG. 1, in the first phase t1 during operation of the shift register: the signal inputted by the input signal terminal INPUT is of a high level, M1 is turned on, the node PU is at a high level, the capacitor C is charged, and M3 is turned on, the signal inputted by the clock signal input terminal CLK is of a low level, the signal output terminal is at a low level; in the second phase t2: the signal inputted by the input signal terminal INPUT is of a low level, M1 is turned off, the capacitor C discharges the node PU, the node PU remains at a high level, M3 remains ON, the signal inputted by the clock signal input terminal CLK is of a high level, the signal output terminal is at a high level; in the third phase t3: the signal inputted by the reset signal input terminal RESET is of a high level, M2 is turned on, the node PU is at a low level, M3, M6 and M8 are turned off, M5 and M7 remain ON, the node PD is of a high level, M4 and M9 are turned on, the signal output terminal is at a low level.

However, as shown in FIG. 2, when the signal input terminal INPUT inputs a high level signal, the PU point at one terminal of the capacitor C rises, such that the other terminal of the capacitor couples noise, thereby resulting in existence of noise in the signal outputted by the signal output terminal OUTPUT; moreover, the signal output terminal OUTPUT is connected with the clock signal input terminal CLK through M3, since the driving capability of the clock signal input terminal CLK is relatively poor, when there is a relatively large load, distortion may easily occur to the signal output terminal OUTPUT.

SUMMARY OF THE INVENTION

An object of the present invention lies in providing a shift register unit and a driving method thereof, a gate driving circuit, and a display device, for solving the problem of existence of noise and distortion in signal outputted by a signal output terminal.

In order to achieve the above object, the present invention provides the following technical solutions:

On a first aspect, the present invention provides a shift register unit, comprising: an input module, an output control module and an output module;

the input module comprising a first input sub-module and a second input sub-module; wherein the first input sub-module is connected to a signal input terminal and a first node, for transmitting a signal inputted by the signal input terminal to the first node; the second input sub-module is connected to the signal input terminal, a low level signal input terminal and a second node, for transmitting a signal inputted by the low level signal input terminal to the second node based on the signal inputted by the signal input terminal;

the output control module is connected to the first node, a clock signal input terminal and the second node, for transmitting a signal inputted by the clock signal input terminal to the second node based on the signal of the first node;

the output module is connected to the second node, a high level signal input terminal and a signal output terminal, for transmitting a signal inputted by the high level signal input terminal to the signal output terminal based on the signal of the second node.

Further, the shift register unit may further comprise: a reset control module and a reset module;

wherein the reset control module is connected to a reset signal input terminal, the low level signal input terminal, the first node, a third node, the high level signal input terminal and the second node, for transmitting the signal inputted by the low level signal input terminal to the first node based on a signal inputted by the reset signal input terminal, transmitting the signal inputted by the high level signal input terminal to the third node, and transmitting the signal inputted by the low level signal input terminal to the first node and the second node based on the signal of the third node; and the reset module is connected to the third node, the low level signal input terminal and the signal output terminal, for transmitting the signal inputted by the low level signal input terminal to the signal output terminal based on the signal of the third node.

Further, the first input sub-module comprises: a first transistor, a gate and a first pole of the first transistor being connected to the signal input terminal and a second pole of the first transistor being connected to the first node.

The second input sub-module comprises: a second transistor, a gate of the second transistor being connected to the signal input terminal, a first pole of the second transistor being connected to the second node and a second pole of the second transistor being connected to the low level signal input terminal.

Further, the output control module comprises: a third transistor and a capacitor;

wherein a gate of the third transistor is connected to the first node, a first pole of the third transistor is connected to the clock signal input terminal, and a second pole of the third transistor is connected to the second node; and one terminal of the capacitor is connected to the first node, and the other terminal of the capacitor is connected to the second node.

Further, the output module comprises: a fourth transistor;

wherein a gate of the fourth transistor is connected to the second node, a first pole of the fourth transistor is connected to the high level signal input terminal, a second pole of the fourth transistor is connected to the signal output terminal.

Further, the reset control module comprises: a fifth transistor, a sixth transistor, a seventh transistor, an eighth transistor, a ninth transistor, a tenth transistor and an eleventh transistor;

wherein a gate of the fifth transistor is connected to the reset signal input terminal, a first pole of the fifth transistor is connected to the first node, and a second pole of the fifth transistor is connected to the low level signal input terminal;

a gate of the sixth transistor is connected to the first node, a first pole of the sixth transistor is connected to a second pole of the eighth transistor, and a second pole of the sixth transistor is connected to the low level signal input terminal;

a gate of the seventh transistor is connected to the first node, a first pole of the seventh transistor is connected to the third node, a second pole of the seventh transistor is connected to the low level signal input terminal;

a gate and a first pole of the eighth transistor are connected to the high level signal input terminal, a second pole of the eighth transistor is connected to the first pole of the sixth transistor;

a gate of the ninth transistor is connected to the second pole of the eighth transistor, a first pole of the ninth transistor is connected to the high level signal input terminal, a second pole of the ninth transistor is connected to the third node;

a gate of the tenth transistor is connected to the third node, a first pole of the tenth transistor is connected to the first node, a second pole of the tenth transistor is connected to the low level signal input terminal;

a gate of the eleventh transistor is connected to the third node, a first pole of the eleventh transistor is connected to the second node, a second pole of the eleventh transistor is connected to the low level signal input terminal.

Further, the reset module comprises: a twelfth transistor;
wherein a gate of the twelfth transistor is connected to the third node, a first pole of the twelfth transistor is connected to the signal output terminal, a second pole of the twelfth transistor is connected to the low level signal input terminal.

On a second aspect, the present invention provides a gate driving circuit, comprising at least two stages of shift register unit as stated above' wherein, except for the first stage of shift register unit, a signal input terminal of each of the other stages of shift register unit is connected with a signal output terminal of a previous stage of shift register unit adjacent to it;

except for the last stage of shift register unit, a reset signal input terminal of each of the other stages of shift register unit is connected with a signal output terminal of a next stage of shift register unit adjacent to it.

On a third aspect, the present invention provides a display device, comprising a gate driving circuit as stated in the second aspect.

On a fourth aspect, the present invention provides a driving method of a shift register unit, the shift register unit comprising: an input module, an output control module, an output module, a reset control module and a reset module;

wherein the input module comprises a first input sub-module and a second input sub-module, the first input sub-module is connected to a signal input terminal and a first node, for transmitting a signal inputted by the signal input terminal to the first node, the second input sub-module is connected to the signal input terminal, a low level signal input terminal and a second node, for transmitting a signal inputted by the low level signal input terminal to the second node based on the signal inputted by the signal input terminal;

the output control module is connected to the first node, a clock signal input terminal and the second node, for transmitting a signal inputted by the clock signal input terminal to the second node based on the signal of the first node;

the output module is connected to the second node, a high level signal input terminal and a signal output terminal, for transmitting a signal inputted by the high level signal input terminal to the signal output terminal based on the signal of the second node;

the reset control module is connected to a reset signal input terminal, the low level signal input terminal, the first node, a third node, the high level signal input terminal and the second node, for transmitting the signal inputted by the low level signal input terminal to the first node based on a signal inputted by the reset signal input terminal, transmitting the signal inputted by the high level signal input terminal to the third node, and transmitting the signal inputted by the low level signal input terminal to the first node and the second node based on the signal of the third node;

the reset module is connected to the third node, the low level signal input terminal and the signal output terminal, for transmitting the signal inputted by the low level signal input terminal to the signal output terminal based on the signal of the third node, the method comprising:

a first phase wherein the signal inputted by the signal input terminal is a high level signal, the first input sub-module transmits the high level signal inputted by the signal input terminal to the first node, the output control module transmits the low level signal inputted by the clock signal input terminal to the second node based on the signal of the first node;

the second input sub-module transmits the signal inputted by the low level signal input terminal to the second node based on the high level signal inputted by the signal input terminal, so as to enable the second node to remain at a low level;

a second phase wherein the signal inputted by the signal input terminal is a low level signal, the first node remains at a high level, the output control module transmits the high level signal inputted by the clock signal input terminal to the second node based on the signal of the first node, the output module transmits the high level signal inputted by the high level signal input terminal to the signal output terminal based on the signal of the second node;

a third phase wherein the signal inputted by the reset signal input terminal is a high level signal, the reset control module transmits the low level signal inputted by the low level signal input terminal to the first node based on the high level signal inputted by the reset signal input terminal, and transmits the high level signal inputted by the high level signal input terminal to the third node;

the reset control module transmits the low level signal inputted by the low level signal input terminal to the second node based on the signal of the third node; the reset module transmits the low level signal inputted by the low level signal input terminal to the signal output terminal based on the signal of the third node.

Further, the first input sub-module comprises: a first transistor, a gate and a first pole of the first transistor being connected to the signal input terminal, a second pole of the first transistor being connected to the first node;

the second input sub-module comprises: a second transistor, a gate of the second transistor being connected to the signal input terminal, a first pole of the second transistor being connected to the second node, a second pole of the second transistor being connected to the low level signal input terminal;

the output control module comprises: a third transistor and a capacitor, a gate of the third transistor being connected to the first node, a first pole of the third transistor being connected to the clock signal input terminal, a second pole of the third transistor being connected to the second node; one terminal of the capacitor being connected to the first node, the other terminal of the capacitor being connected to the second node, and wherein in the first phase, the high level signal inputted by the signal input terminal controls the first transistor to be turned on, the high level signal inputted by the signal input terminal is transmitted to the first node, the first node charges the capacitor and controls the third transistor to be turned on, the low level signal inputted by the clock signal input terminal is transmitted to the second node;

the high level signal inputted by the signal input terminal controls the second transistor to be turned on, the signal inputted by the low level signal input terminal is transmitted to the second node, the second node discharges the capacitor so as to enable the second node to remain at a low level.

Further, the output module comprises a fourth transistor, a gate of the fourth transistor being connected to the second node, a first pole of the fourth transistor being connected to the high level signal input terminal, a second pole of the fourth transistor being connected to the signal output terminal, and wherein in the second phase, the low level signal inputted by the signal input terminal enables the first transistor and the second transistor to be turned off, the capacitor is discharged, and the first node remains at a high level, the high level signal inputted by the clock signal input terminal is transmitted to the second node, the second node controls the fourth transistor to be turned on, the high level signal inputted by the high level signal input terminal is transmitted to the signal output terminal.

Further, the reset control module comprises: a fifth transistor, a sixth transistor, a seventh transistor, an eighth transistor, a ninth transistor, a tenth transistor and an eleventh transistor, a gate of the fifth transistor being connected to the reset signal input terminal, a first pole of the fifth transistor being connected to the first node, a second pole of the fifth transistor being connected to the low level signal input terminal; a gate of the sixth transistor being connected to the first node, a first pole of the sixth transistor being connected to a second pole of the eighth transistor, a second pole of the sixth transistor being connected to the low level signal input terminal; a gate of the seventh transistor being connected to the first node, a first pole of the seventh transistor being connected to the third node, a second pole of the seventh transistor being connected to the low level signal input terminal; a gate and a first pole of the eighth transistor being connected to the high level signal input terminal, a second pole of the eighth transistor being connected to the first pole of the sixth transistor; a gate of the ninth transistor being connected to the second pole of the eighth transistor, a first pole of the ninth transistor being connected to the high level signal input terminal, a second pole of the ninth transistor being connected to the third node; a gate of the tenth transistor being connected to the third node, a first pole of the tenth transistor being connected to the first node, a second pole of the tenth transistor being connected to the low level signal input terminal; a gate of the eleventh transistor being connected to the third node, a first pole of the eleventh transistor being connected to the second node, a second pole of the eleventh transistor being connected to the low level signal input terminal, the reset module comprises: a twelfth transistor, a gate of the twelfth transistor being connected to the third node, a first pole of the twelfth transistor being connected to the signal output terminal, a second pole of the twelfth transistor being connected to the low level signal input terminal, and wherein in the third phase, the high level signal inputted by the reset signal input terminal controls the fifth transistor to be turned on, the low level signal inputted by the low level signal input terminal is transmitted to the first node, the sixth transistor and the seventh transistor are turned off;

the high level signal inputted by the high level signal input terminal controls the eighth transistor and the ninth transistor to be turned on, the high level signal inputted by the high level signal input terminal is transmitted to the third node; the third node controls the eleventh transistor to be turned on, the low level signal inputted by the low level signal input terminal is transmitted to the second node, the second node discharges the capacitor; the third node controls the twelfth transistor to be turned on, the low level signal inputted by the low level signal input terminal is transmitted to the signal output terminal.

As stated above, the level rising of the first node at one terminal of the capacitor may cause the second node at the other terminal to couple noise. In the shift register unit and the driving method thereof, the gate driving circuit, and the display device provided by the present invention, the second input sub-module transmits the signal inputted by the low level signal input terminal to the second node based on the signal inputted by the signal input terminal, by performing signal transmission with the low level signal input terminal, noise release can be performed to the second node, thereby being capable of avoiding noise in the signal outputted by the signal output terminal; moreover, the output module transmits the signal inputted by the high level signal input terminal to the signal output terminal based on the signal of the second node, since the driving capability of the high level signal input terminal is relatively strong, occurrence of distortion at the signal output terminal can be avoided.

BRIEF DESCRIPTION OF THE DRAWINGS

The drawings illustrated here are used for providing further understanding to the present invention, and constitute part of the present invention, the schematic embodiments of the present invention and explanations thereof are used for explaining the present invention, but do not constitute inappropriate definitions to the present invention. In the drawings.

| Reference signs: | |
|---|---|
| 1-input module, | 2-output control module, |
| 3-output module, | 11-first input sub-module, |
| 12-second input sub-module, | 4-reset control module, |
| 5-reset module. | |

DETAILED DESCRIPTION OF THE INVENTION

Next, technical solutions in embodiments of the present invention will be described clearly and completely with reference to the drawings in the embodiments of the present invention, apparently, the embodiments described are only a part of rather than all of the embodiments of the present invention. Based on the embodiments in the present invention, all other embodiments obtained by the ordinary skilled person in the art on the premise of not paying any creative work should belong to the protection scope of the present invention.

Embodiment One

Figure 1:
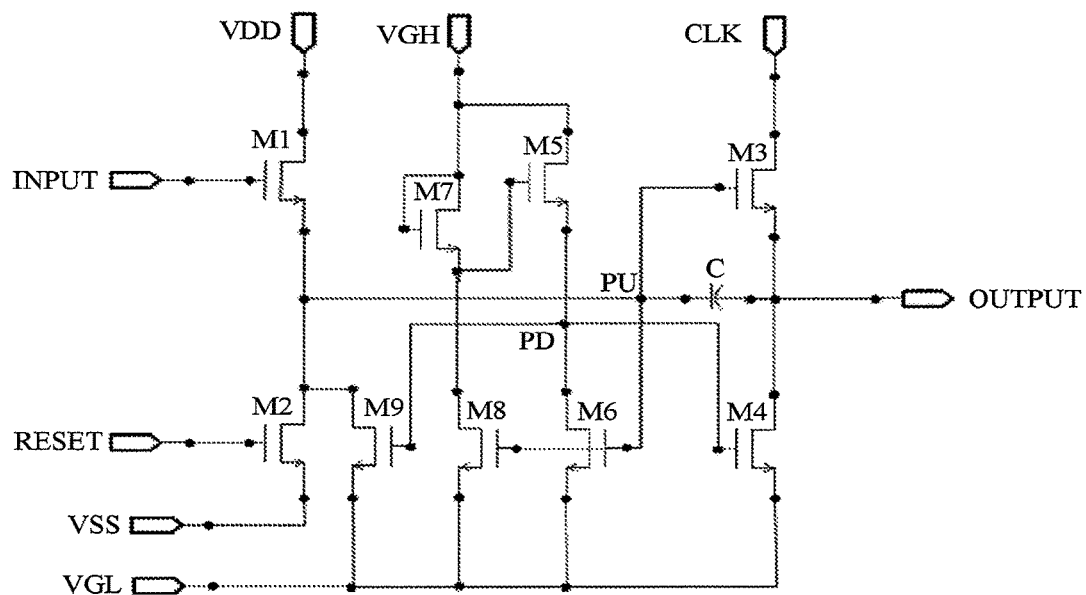
FIG. 1 is a schematic view of circuit of a shift register unit in the prior art.
Figure 2:
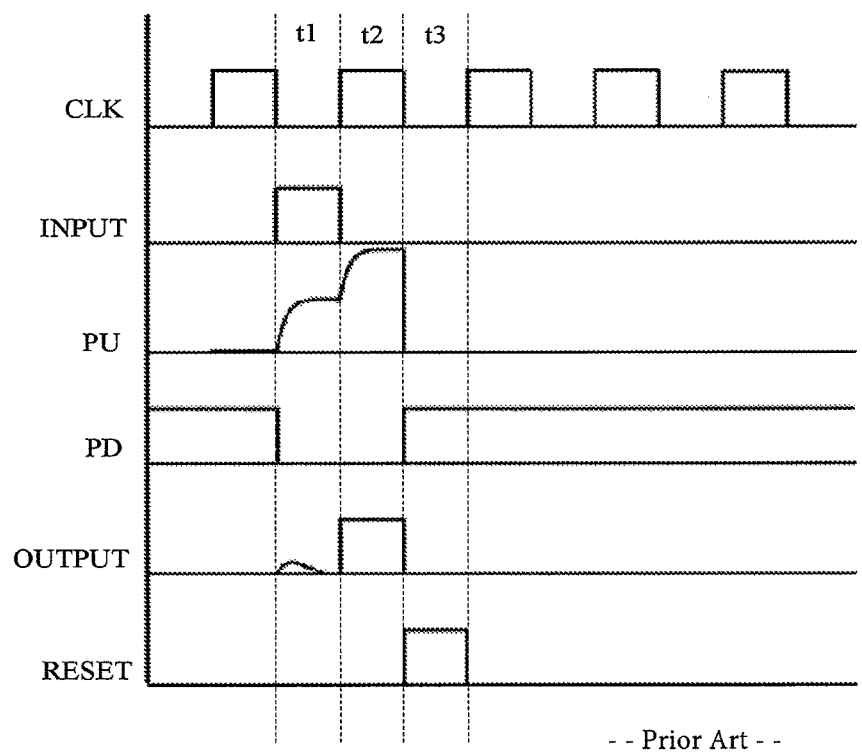
FIG. 2 is a timing diagram of the driving process of FIG. 1.
Figure 3:
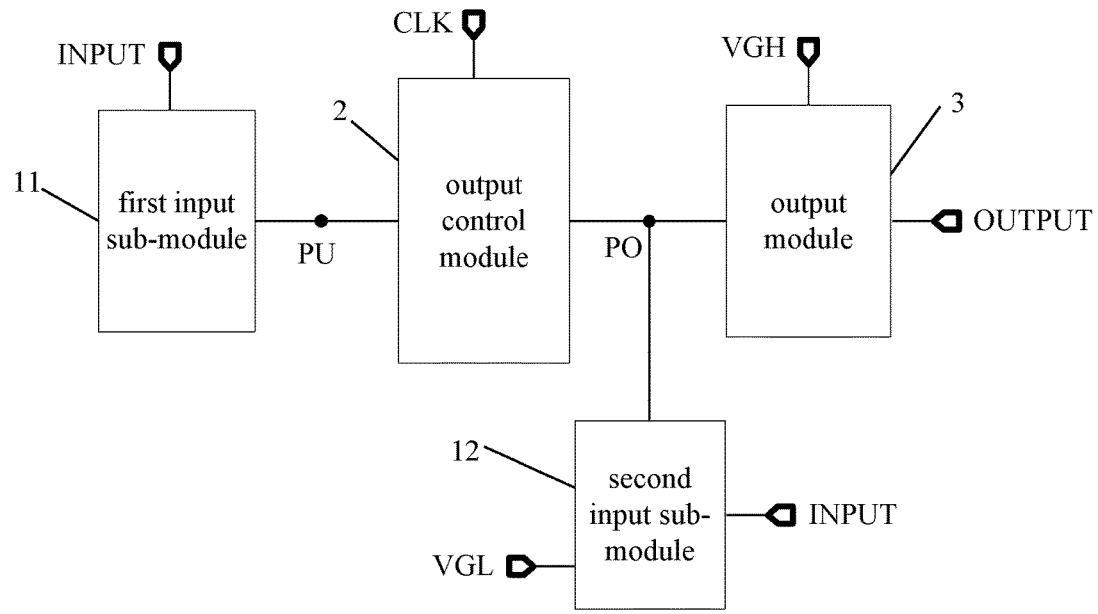
FIG. 3 is a schematic view of modules of a shift register unit in an embodiment of the present invention.

An embodiment of the present invention provides a shift register unit, as shown in FIG. 3, the shift register unit comprises: an input module 1, an output control module 2 and an output module 3.

The input module 1 comprises a first input sub-module 11 and a second input sub-module 12.

Wherein, the first input sub-module 11 is connected to a signal input terminal INPUT and a first node PU, for transmitting a signal inputted by the signal input terminal INPUT to the first node PU. The second input sub-module 12 is connected to the signal input terminal INPUT, a low level signal input terminal VGL and a second node PO, for transmitting a signal inputted by the low level signal input terminal VGL to the second node PO based on the signal inputted by the signal input terminal INPUT.

The output control module 2 is connected to the first node PU, a clock signal input terminal CLK and the second node PO, for transmitting a signal inputted by the clock signal input terminal CLK to the second node PO based on the signal of the first node PU.

The output module 3 is connected to the second node PO, a high level signal input terminal VGH and a signal output terminal OUTPUT, for transmitting a signal inputted by the high level signal input terminal VGH to the signal output terminal OUTPUT based on the signal of the second node PO.

Figure 4:
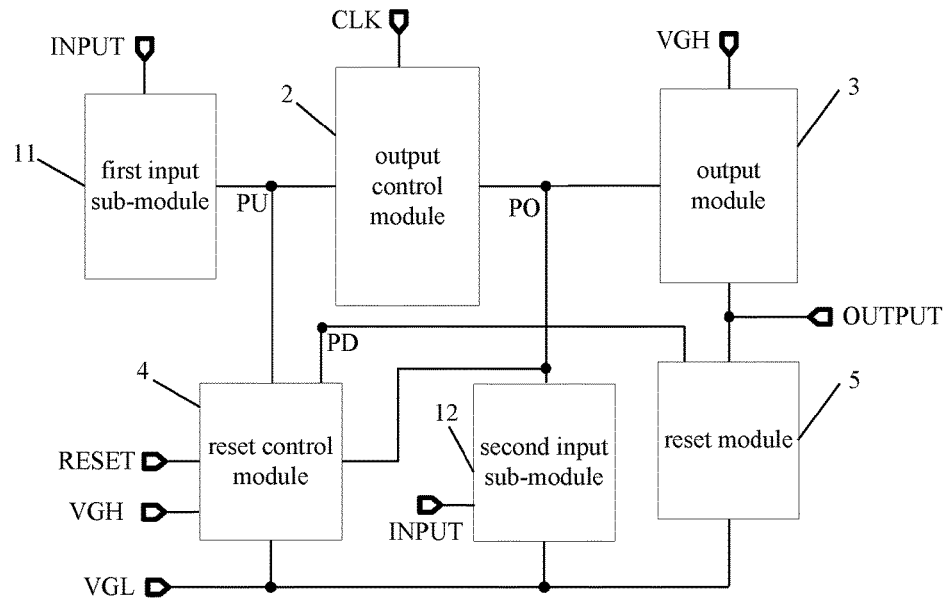
FIG. 4 is a schematic view of modules of another shift register unit in an embodiment of the present invention.

Optionally, as shown in FIG. 4, the shift register unit further comprises: a reset control module 4, a reset module 5.

The reset control module 4 is connected to a reset signal input terminal RESET, the low level signal input terminal VGL, the first node PU, a third node PD, the high level signal input terminal VGH and the second node PO, for transmitting the signal inputted by the low level signal input terminal VGL to the first node PU based on a signal inputted by the reset signal input terminal RESET, transmitting the signal inputted by the high level signal input terminal VGH to the third node PD, and transmitting the signal inputted by the low level signal input terminal VGL to the first node PU and the second node PO based on the signal of the third node PD.

The reset module 5 is connected to the third node PD, the low level signal input terminal VGL and the signal output terminal OUTPUT, for transmitting the signal inputted by the low level signal input terminal VGL to the signal output terminal OUTPUT based on the signal of the third node PD.

Figure 5:
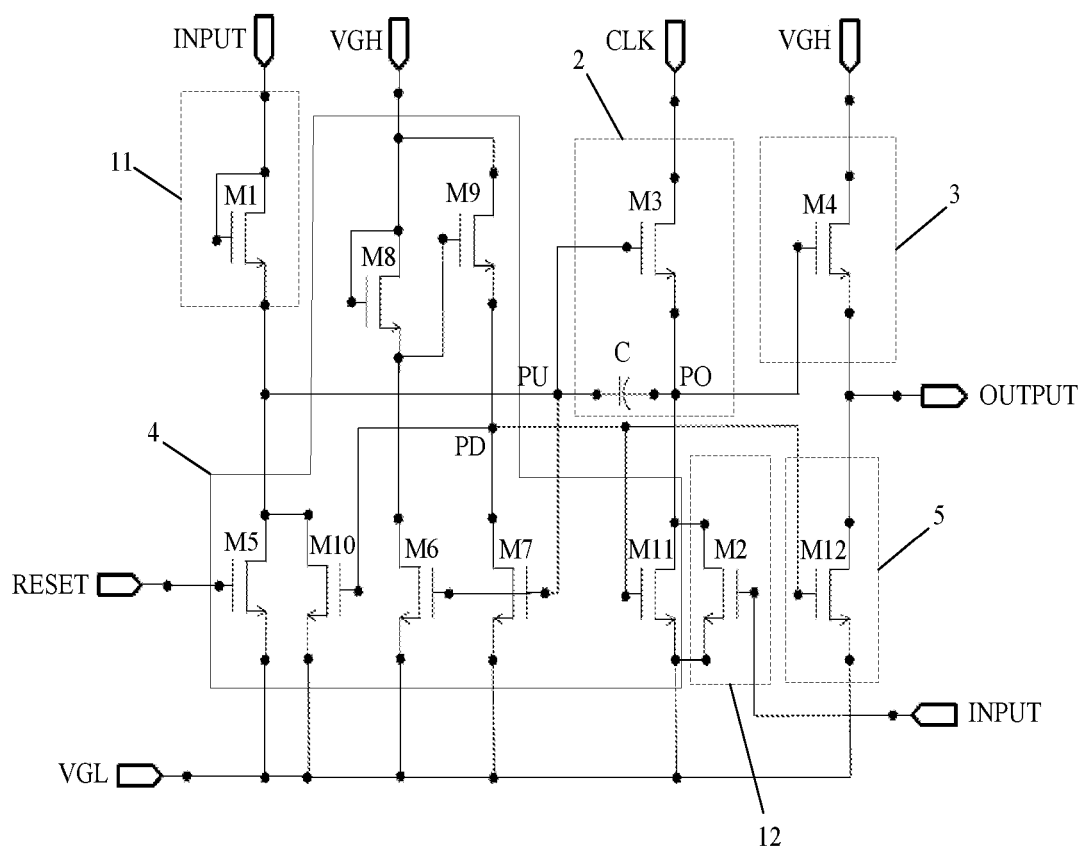
FIG. 5 is a schematic view of circuit of a shift register unit in an embodiment of the present invention.

In order to facilitate understanding of the skilled person in the art, as shown in FIG. 5, an embodiment of the present invention provides the specific structures of the modules as stated above:

Optionally, the first input sub-module 11 comprises: a first transistor M1, a gate and a first pole of the first transistor M1 being connected to the signal input terminal INPUT and a second pole of the first transistor M1 being connected to the first node PU.

The second input sub-module 12 comprises: a second transistor M2, a gate of the second transistor M2 being connected to the signal input terminal INPUT, a first pole of the second transistor M2 being connected to the second node PO and a second pole of the second transistor M2 being connected to the low level signal input terminal VGL.

Optionally, the output control module 2 comprises: a third transistor M3 and a capacitor C.

A gate of the third transistor M3 is connected to the first node PU, a first pole of the third transistor M3 is connected to the clock signal input terminal CLK, and a second pole of the third transistor M3 is connected to the second node PO.

One terminal of the capacitor C is connected to the first node PU, and the other terminal of the capacitor C is connected to the second node PO.

Optionally, the output module 3 comprises: a fourth transistor M4.

A gate of the fourth transistor M4 is connected to the second node PO, a first pole of the fourth transistor M4 is connected to the high level signal input terminal VGH, a second pole of the fourth transistor M4 is connected to the signal output terminal OUTPUT.

Optionally, the reset control module 4 comprises: a fifth transistor M5, a sixth transistor M6, a seventh transistor M7, an eighth transistor M8, a ninth transistor M9, a tenth transistor M10 and an eleventh transistor M11.

A gate of the fifth transistor M5 is connected to the reset signal input terminal RESET, a first pole of the fifth transistor M5 is connected to the first node PU, and a second pole of the fifth transistor M5 is connected to the low level signal input terminal VGL.

A gate of the sixth transistor M6 is connected to the first node PU, a first pole of the sixth transistor M6 is connected to a second pole of the eighth transistor M8, and a second pole of the sixth transistor M6 is connected to the low level signal input terminal VGL.

A gate of the seventh transistor M7 is connected to the first node PU, a first pole of the seventh transistor M7 is connected to the third node PD, a second pole of the seventh transistor M7 is connected to the low level signal input terminal VGL.

A gate and a first pole of the eighth transistor M8 are connected to the high level signal input terminal VGH, a second pole of the eighth transistor M8 is connected to the first pole of the sixth transistor M6.

A gate of the ninth transistor M9 is connected to the second pole of the eighth transistor M8, a first pole of the ninth transistor M9 is connected to the high level signal input terminal VGH, a second pole of the ninth transistor M9 is connected to the third node PD.

A gate of the tenth transistor M10 is connected to the third node PD, a first pole of the tenth transistor M10 is connected to the first node PU, a second pole of the tenth transistor M10 is connected to the low level signal input terminal VGL.

A gate of the eleventh transistor M11 is connected to the third node PD, a first pole of the eleventh transistor M11 is connected to the second node PO, a second pole of the eleventh transistor M11 is connected to the low level signal input terminal VGL.

Optionally, the reset module 5 comprises: a twelfth transistor M12.

A gate of the twelfth transistor M12 is connected to the third node PD, a first pole of the twelfth transistor M12 is connected to the signal output terminal OUTPUT, a second pole of the twelfth transistor M12 is connected to the low level signal input terminal VGL.

It needs to be explained that the first to the twelfth thin film transistors stated above can all be PMOSFETs, and can also be NMOSFETs, embodiments of the present invention do not make definition to this. Exemplarily, the first to the twelfth thin film transistors in an embodiment of the present invention are all selected as NMOSFETs.

As stated above, the level rising of the first node at one terminal of the capacitor may cause the second node at the other terminal to couple noise. In the shift register unit provided by the present invention, the second input sub-module transmits the signal inputted by the low level signal input terminal to the second node based on the signal inputted by the signal input terminal, by performing signal transmission with the low level signal input terminal, noise release can be performed to the second node, thereby being capable of avoiding noise in the signal outputted by the signal output terminal; moreover, the output module transmits the signal inputted by the high level signal input terminal to the signal output terminal based on the signal of the second node, since the driving capability of the high level signal input terminal is relatively strong, occurrence of distortion at the signal output terminal can be avoided.

Figure 6:
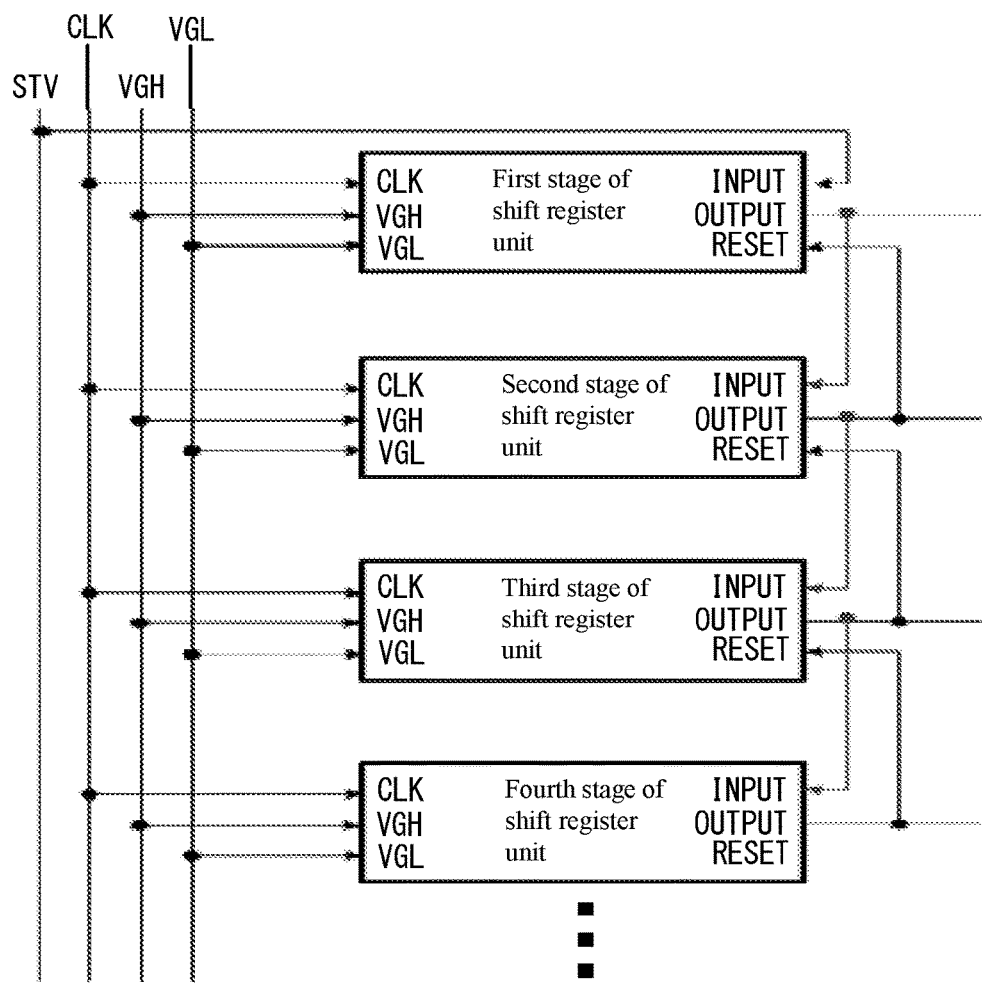
FIG. 6 is a schematic view of modules of a gate driving circuit in an embodiment of the present invention.

In addition, an embodiment of the present invention further provides a gate driving circuit, as shown in FIG. 6, the gate driving circuit comprises at least two stages of the above shift register unit. Wherein, except for the first stage of shift register unit, a signal input terminal INPUT of each of the other stages of shift register unit is connected with a signal output terminal OUTPUT of a previous stage of shift register unit adjacent to it; except for the last stage of shift register unit, a reset signal input terminal RESET of each of the other stages of shift register unit is connected with a signal output terminal OUTPUT of a next stage of shift register unit adjacent to it.

An embodiment of the present invention further provides a display device, the display device comprising the gate driving circuit stated above. The display device can be any product or component with the display function such as a liquid crystal panel, a panel computer, a television, a display, a laptop, electronic paper, a mobile phone, a digital photo frame, a navigator etc.

The gate driving circuit and the display device provided by the embodiment of the present invention can implement the functions of the shift register unit provided above, please refer to the explanations on the shift register unit in the above embodiment for the specific structures, which will not be repeated here.

Embodiment Two

Figure 7:
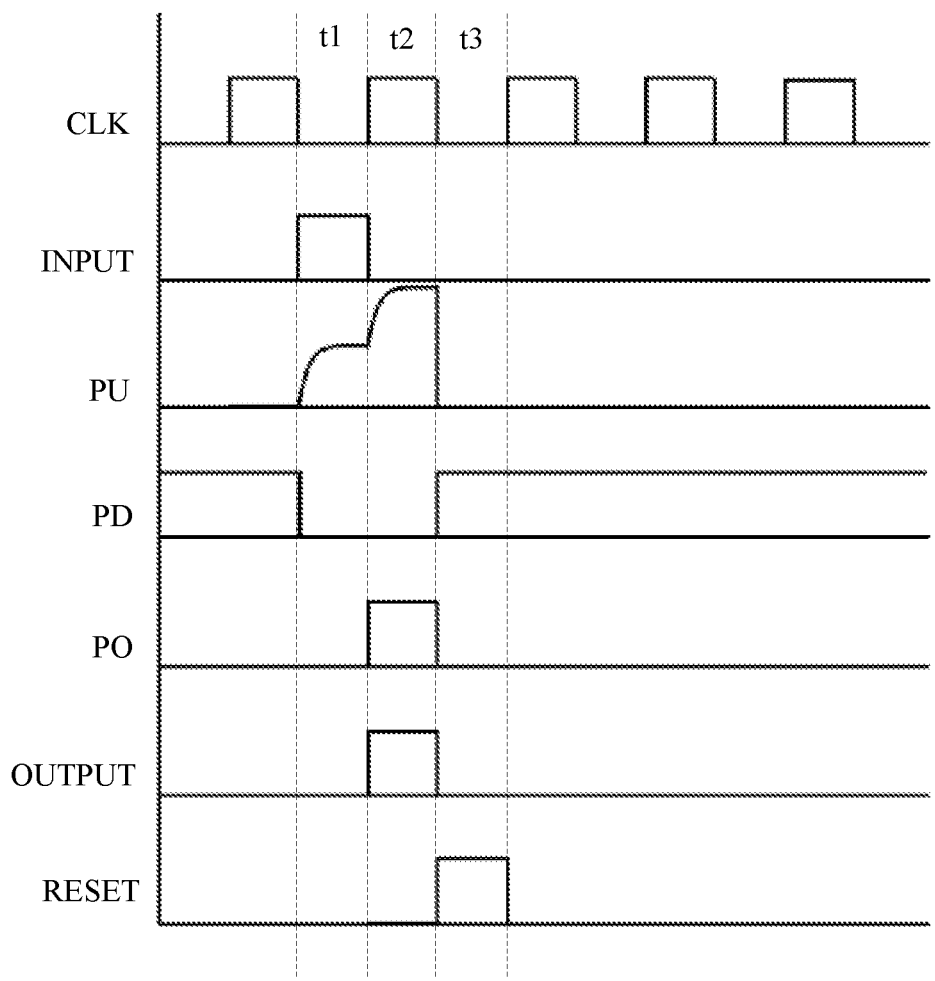
FIG. 7 is a timing diagram of the driving process of FIG. 5.

An embodiment of the present invention provides a driving method of a shift register unit stated in Embodiment one, the driving method of the shift register unit as shown in FIG. 4 is divided into three phases, the timing diagram of the driving process is as shown in FIG. 7.

More specifically, the driving method of the shift register unit may comprise:

a first phase:

wherein the signal inputted by the signal input terminal INPUT is a high level signal, the first input sub-module 11 transmits the high level signal inputted by the signal input terminal to the first node PU, the output control module 2 transmits the low level signal inputted by the clock signal input terminal CLK to the second node PO based on the signal of the first node PU;

the second input sub-module 12 transmits the signal inputted by the low level signal input terminal VGL to the second node PO based on the high level signal inputted by the signal input terminal INPUT, so as to enable the second node PO to remain at a low level;

a second phase wherein the signal inputted by the signal input terminal INPUT is a low level signal, the first node PU remains at a high level, the output control module 2 transmits the high level signal inputted by the clock signal input terminal CLK to the second node PO based on the signal of the first node PU, the output module 3 transmits the high level signal inputted by the high level signal input terminal VGH to the signal output terminal OUTPUT based on the signal of the second node PO;

a third phase wherein the signal inputted by the reset signal input terminal RESET is a high level signal, the reset control module 4 transmits the low level signal inputted by the low level signal input terminal VGL to the first node PU based on the high level signal inputted by the reset signal input terminal, and transmits the high level signal inputted by the high level signal input terminal VGH to the third node PD;

the reset control module 4 transmits the low level signal inputted by the low level signal input terminal VGL to the second node PO based on the signal of the third node PD; the reset module 5 transmits the low level signal inputted by the low level signal input terminal VGL to the signal output terminal OUTPUT based on the signal of the third node PD.

Further, the driving method of the shift register unit as shown in FIG. 5 will be described in detail below. The driving method of the shift register unit as shown in FIG. 5 is divided into three phases, and the timing diagram of the driving process is as shown in FIG. 7.

It needs to be explained that the three phases are only described in detail below by taking all the first to the twelfth thin film transistors as NMOSFETs, here, all the first to the twelfth thin film transistors are turned on when the signal applied on the gate is a high level signal, and turned off when the signal applied on the gate is a low level signal.

The First Phase t1:

The signal inputted by the signal input terminal INPUT is a high level signal, the high level signal controls the first transistor M1 to turn on, the high level signal is transmitted to the first node PU, the first node PU charges the capacitor C, and controls the third transistor M3 to turn on, the low level signal inputted by the clock signal input terminal CLK is transmitted to the second node PO.

The high level signal controls the second transistor M2 to turn on at the same time, the signal inputted by the low level signal input terminal VGL is transmitted to the second node PO, the second node PO discharges the capacitor C, so as to enable the second node PO to remain at a low level.

The Second Phase t2:

The signal inputted by the signal input terminal INPUT is a low level signal, the first transistor M1 and the second transistor M2 are turned off, the capacitor C is discharged, the first node PU remains at a high level, the high level signal inputted by the clock signal input terminal CLK is transmitted to the second node PO, the second node PO controls the fourth transistor M4 to turn on, the high level signal inputted by the high level signal input terminal VGH is transmitted to the signal output terminal OUTPUT.

The Third Phase t3:

The signal inputted by the reset signal input terminal RESET is a high level signal, the high level signal control the fifth transistor M5 to turn on, the low level signal inputted by the low level signal input terminal VGL is transmitted to the first node PU, the sixth transistor M6 and the seventh transistor M7 are turned off.

The high level signal inputted by the high level signal input terminal VGH controls the eight transistor M8 and the ninth transistor M9 to turn on, the high level signal is transmitted to the third node PD. The third node PD controls the eleventh transistor M11 to turn on, the low level signal inputted by the low level signal input terminal VGL is transmitted to the second node PO, the second node PO discharges the capacitor C. The third node PD controls the twelfth transistor M12 to turn on at the same time, the low level signal inputted by the low level signal input terminal VGL is transmitted to the signal output terminal OUTPUT.

As stated above, the level rising of the first node at one terminal of the capacitor may cause the second node at the other terminal to couple noise. In the driving method of the shift register unit provided by the present invention, the second input sub-module transmits the signal inputted by the low level signal input terminal to the second node based on the signal inputted by the signal input terminal, by performing signal transmission with the low level signal input terminal, noise release can be performed to the second node, thereby being capable of avoiding noise in the signal outputted by the signal output terminal; moreover, the output module transmits the signal inputted by the high level signal input terminal to the signal output terminal based on the signal of the second node, since the driving capability of the high level signal input terminal is relatively strong, occurrence of distortion at the signal output terminal can be avoided.

Through the above description of the embodiments, the skilled person in the art can understand clearly that the present invention can be carried out by means of software plus necessary general hardware, certainly can also be carried out through hardware. Based on such understanding, the technical solutions of the present invention in essence or the part that makes contribution to the prior art can be represented in the form of a software product, the computer software product is stored in a readable storage medium, such as a floppy disk, a hard disk or an optical disk, including several instructions for enabling a computer device (which may be a personal computer, a server, or a network device etc.) to carry out the methods as stated in respective embodiments of the present invention.

What are stated above are only specific embodiments of the present invention, however, the protection scope of the present invention is not limited to this, any modifications or replacements that can be easily conceived by the skilled person familiar with the present technical field within the technical scope disclosed by the present invention should be encompassed within the protection scope of the present invention. Therefore, the protection scope of the present invention should be subject to the protection scopes of claims.

The invention claimed is:

1. A shift register unit, comprising: an input module, an output control module and an output module;
    the input module comprising a first input sub-module and a second input sub-module; wherein the first input sub-module is connected to a signal input terminal and a first node, for transmitting a signal inputted by the signal input terminal to the first node; the second input sub-module is connected to the signal input terminal, a low level signal input terminal and a second node, for transmitting a signal inputted by the low level signal input terminal to the second node based on the signal inputted by the signal input terminal;
    the output control module is connected to the first node, a clock signal input terminal and the second node, for transmitting a signal inputted by the clock signal input terminal to the second node based on the signal of the first node;
    the output module is connected to the second node, a high level signal input terminal and a signal output terminal, for transmitting a signal inputted by the high level signal input terminal to the signal output terminal based on the signal of the second node,
    wherein the shift register unit further comprises: a reset control module and a reset module;
    wherein the reset control module is connected to a reset signal input terminal, the low level signal input terminal, the first node, a third node, the high level signal input terminal and the second node, for transmitting the signal inputted by the low level signal input terminal to the first node based on a signal inputted by the reset signal input terminal, transmitting the signal inputted by the high level signal input terminal to the third node, and transmitting the signal inputted by the low level signal input terminal to the first node and the second node based on the signal of the third node; and
    the reset module is connected to the third node, the low level signal input terminal and the signal output terminal, for transmitting the signal inputted by the low level signal input terminal to the signal output terminal based on the signal of the third node.

2. The shift register unit according to claim 1, wherein the first input sub-module comprises: a first transistor, a gate and a first pole of the first transistor being connected to the signal input terminal and a second pole of the first transistor being connected to the first node;
    the second input sub-module comprises: a second transistor, a gate of the second transistor being connected to the signal input terminal, a first pole of the second transistor being connected to the second node and a second pole of the second transistor being connected to the low level signal input terminal.

3. The shift register unit according to claim 1, wherein the output control module comprises: a third transistor and a capacitor;
    wherein a gate of the third transistor is connected to the first node, a first pole of the third transistor is connected to the clock signal input terminal, and a second pole of the third transistor is connected to the second node; and
    one terminal of the capacitor is connected to the first node, and the other terminal of the capacitor is connected to the second node.

4. The shift register unit according to claim 1, wherein the output module comprises: a fourth transistor;
wherein a gate of the fourth transistor is connected to the second node, a first pole of the fourth transistor is connected to the high level signal input terminal, a second pole of the fourth transistor is connected to the signal output terminal.

5. The shift register unit according to claim 1, wherein the reset control module comprises: a fifth transistor, a sixth transistor, a seventh transistor, an eighth transistor, a ninth transistor, a tenth transistor and an eleventh transistor;
wherein a gate of the fifth transistor is connected to the reset signal input terminal, a first pole of the fifth transistor is connected to the first node, and a second pole of the fifth transistor is connected to the low level signal input terminal;
a gate of the sixth transistor is connected to the first node, a first pole of the sixth transistor is connected to a second pole of the eighth transistor, and a second pole of the sixth transistor is connected to the low level signal input terminal;
a gate of the seventh transistor is connected to the first node, a first pole of the seventh transistor is connected to the third node, a second pole of the seventh transistor is connected to the low level signal input terminal;
a gate and a first pole of the eighth transistor are connected to the high level signal input terminal, a second pole of the eighth transistor is connected to the first pole of the sixth transistor;
a gate of the ninth transistor is connected to the second pole of the eighth transistor, a first pole of the ninth transistor is connected to the high level signal input terminal, a second pole of the ninth transistor is connected to the third node;
a gate of the tenth transistor is connected to the third node, a first pole of the tenth transistor is connected to the first node, a second pole of the tenth transistor is connected to the low level signal input terminal;
a gate of the eleventh transistor is connected to the third node, a first pole of the eleventh transistor is connected to the second node, a second pole of the eleventh transistor is connected to the low level signal input terminal.

6. The shift register unit according to claim 1, wherein the reset module comprises: a twelfth transistor;
wherein a gate of the twelfth transistor is connected to the third node, a first pole of the twelfth transistor is connected to the signal output terminal, a second pole of the twelfth transistor is connected to the low level signal input terminal.

7. A gate driving circuit, comprising at least two stages of shift register unit according to claim 1;
wherein, except for the first stage of shift register unit, a signal input terminal of each of the other stages of shift register unit is connected with a signal output terminal of a previous stage of shift register unit adjacent to it;
except for the last stage of shift register unit, a reset signal input terminal of each of the other stages of shift register unit is connected with a signal output terminal of a next stage of shift register unit adjacent to it.

8. A display device comprising a gate driving circuit according to claim 7.

9. The gate driving circuit according to claim 7, wherein the first input sub-module comprises: a first transistor, a gate and a first pole of the first transistor being connected to the signal input terminal and a second pole of the first transistor being connected to the first node;
the second input sub-module comprises: a second transistor, a gate of the second transistor being connected to the signal input terminal, a first pole of the second transistor being connected to the second node and a second pole of the second transistor being connected to the low level signal input terminal.

10. The gate driving circuit according to claim 7, wherein the output control module comprises: a third transistor and a capacitor;
wherein a gate of the third transistor is connected to the first node, a first pole of the third transistor is connected to the clock signal input terminal, and a second pole of the third transistor is connected to the second node; and
one terminal of the capacitor is connected to the first node, and the other terminal of the capacitor is connected to the second node.

11. The gate driving circuit according to claim 7, wherein the output module comprises: a fourth transistor;
wherein a gate of the fourth transistor is connected to the second node, a first pole of the fourth transistor is connected to the high level signal input terminal, a second pole of the fourth transistor is connected to the signal output terminal.

12. The gate driving circuit according to claim 7, wherein the reset control module comprises: a fifth transistor, a sixth transistor, a seventh transistor, an eighth transistor, a ninth transistor, a tenth transistor and an eleventh transistor;
wherein a gate of the fifth transistor is connected to the reset signal input terminal, a first pole of the fifth transistor is connected to the first node, and a second pole of the fifth transistor is connected to the low level signal input terminal;
a gate of the sixth transistor is connected to the first node, a first pole of the sixth transistor is connected to a second pole of the eighth transistor, and a second pole of the sixth transistor is connected to the low level signal input terminal;
a gate of the seventh transistor is connected to the first node, a first pole of the seventh transistor is connected to the third node, a second pole of the seventh transistor is connected to the low level signal input terminal;
a gate and a first pole of the eighth transistor are connected to the high level signal input terminal, a second pole of the eighth transistor is connected to the first pole of the sixth transistor;
a gate of the ninth transistor is connected to the second pole of the eighth transistor, a first pole of the ninth transistor is connected to the high level signal input terminal, a second pole of the ninth transistor is connected to the third node;
a gate of the tenth transistor is connected to the third node, a first pole of the tenth transistor is connected to the first node, a second pole of the tenth transistor is connected to the low level signal input terminal;
a gate of the eleventh transistor is connected to the third node, a first pole of the eleventh transistor is connected to the second node, a second pole of the eleventh transistor is connected to the low level signal input terminal.

13. The gate driving circuit according to claim 7, wherein the reset module comprises: a twelfth transistor;
wherein a gate of the twelfth transistor is connected to the third node, a first pole of the twelfth transistor is connected to the signal output terminal, a second pole of the twelfth transistor is connected to the low level signal input terminal.

14. A driving method of a shift register unit, the shift register unit comprising: an input module, an output control module, an output module, a reset control module and a reset module;

wherein the input module comprises a first input sub-module and a second input sub-module, the first input sub-module is connected to a signal input terminal and a first node, for transmitting a signal inputted by the signal input terminal to the first node, the second input sub-module is connected to the signal input terminal, a low level signal input terminal and a second node, for transmitting a signal inputted by the low level signal input terminal to the second node based on the signal inputted by the signal input terminal;

the output control module is connected to the first node, a clock signal input terminal and the second node, for transmitting a signal inputted by the clock signal input terminal to the second node based on the signal of the first node;

the output module is connected to the second node, a high level signal input terminal and a signal output terminal, for transmitting a signal inputted by the high level signal input terminal to the signal output terminal based on the signal of the second node;

the reset control module is connected to a reset signal input terminal, the low level signal input terminal, the first node, a third node, the high level signal input terminal and the second node, for transmitting the signal inputted by the low level signal input terminal to the first node based on a signal inputted by the reset signal input terminal, transmitting the signal inputted by the high level signal input terminal to the third node, and transmitting the signal inputted by the low level signal input terminal to the first node and the second node based on the signal of the third node;

the reset module is connected to the third node, the low level signal input terminal and the signal output terminal, for transmitting the signal inputted by the low level signal input terminal to the signal output terminal based on the signal of the third node, the method comprising:

a first phase;

wherein the signal inputted by the signal input terminal is a high level signal, the first input sub-module transmits the high level signal inputted by the signal input terminal to the first node, the output control module transmits the low level signal inputted by the clock signal input terminal to the second node based on the signal of the first node;

the second input sub-module transmits the signal inputted by the low level signal input terminal to the second node based on the high level signal inputted by the signal input terminal, so as to enable the second node to remain at a low level;

a second phase;

wherein the signal inputted by the signal input terminal is a low level signal, the first node remains at a high level, the output control module transmits the high level signal inputted by the clock signal input terminal to the second node based on the signal of the first node, the output module transmits the high level signal inputted by the high level signal input terminal to the signal output terminal based on the signal of the second node;

a third phase;

wherein the signal inputted by the reset signal input terminal is a high level signal, the reset control module transmits the low level signal inputted by the low level signal input terminal to the first node based on the high level signal inputted by the reset signal input terminal, and transmits the high level signal inputted by the high level signal input terminal to the third node;

the reset control module transmits the low level signal inputted by the low level signal input terminal to the second node based on the signal of the third node; the reset module transmits the low level signal inputted by the low level signal input terminal to the signal output terminal based on the signal of the third node.

15. The driving method of a shift register unit according to claim 14, wherein the first input sub-module comprises: a first transistor, a gate and a first pole of the first transistor being connected to the signal input terminal, a second pole of the first transistor being connected to the first node;

the second input sub-module comprises: a second transistor, a gate of the second transistor being connected to the signal input terminal, a first pole of the second transistor being connected to the second node, a second pole of the second transistor being connected to the low level signal input terminal;

the output control module comprises: a third transistor and a capacitor, a gate of the third transistor being connected to the first node, a first pole of the third transistor being connected to the clock signal input terminal, a second pole of the third transistor being connected to the second node; one terminal of the capacitor being connected to the first node, the other terminal of the capacitor being connected to the second node, and wherein in the first phase, the high level signal inputted by the signal input terminal controls the first transistor to be turned on, the high level signal inputted by the signal input terminal is transmitted to the first node, the first node charges the capacitor and controls the third transistor to be turned on, the low level signal inputted by the clock signal input terminal is transmitted to the second node;

the high level signal inputted by the signal input terminal controls the second transistor to be turned on, the signal inputted by the low level signal input terminal is transmitted to the second node, the second node discharges the capacitor so as to enable the second node to remain at a low level.

16. The driving method of a shift register unit according to claim 15, wherein the output module comprises a fourth transistor, a gate of the fourth transistor being connected to the second node, a first pole of the fourth transistor being connected to the high level signal input terminal, a second pole of the fourth transistor being connected to the signal output terminal, and wherein in the second phase, the low level signal inputted by the signal input terminal enables the first transistor and the second transistor to be turned off, the capacitor is discharged, and the first node remains at a high level, the high level signal inputted by the clock signal input terminal is transmitted to the second node, the second node controls the fourth transistor to be turned on, the high level signal inputted by the high level signal input terminal is transmitted to the signal output terminal.

17. The driving method of a shift register unit according to claim 16, wherein the reset control module comprises: a fifth transistor, a sixth transistor, a seventh transistor, an eighth transistor, a ninth transistor, a tenth transistor and an eleventh transistor, a gate of the fifth transistor being connected to the reset signal input terminal, a first pole of the fifth transistor being connected to the first node, a second pole of the fifth transistor being connected to the low level signal input terminal; a gate of the sixth transistor being connected to the first node, a first pole of the sixth transistor being connected to a second pole of the eighth transistor, a second pole of the sixth transistor being connected to the low level signal input terminal; a gate of the seventh transistor being connected to the first node, a first pole of the seventh transistor being connected to the third node, a second pole of the seventh transistor being connected to the low level signal input terminal; a gate and a first pole of the eighth transistor being connected to the high level signal input terminal, a second pole of the eighth transistor being connected to the first pole of the sixth transistor; a gate of the ninth transistor being connected to the second pole of the eighth transistor, a first pole of the ninth transistor being connected to the high level signal input terminal, a second pole of the ninth transistor being connected to the third node; a gate of the tenth transistor being connected to the third node, a first pole of the tenth transistor being connected to the first node, a second pole of the tenth transistor being connected to the low level signal input terminal; a gate of the eleventh transistor being connected to the third node, a first pole of the eleventh transistor being, connected to the second node, a second pole of the eleventh transistor being connected to the low level signal input terminal, the reset module comprises: a twelfth transistor, a gate of the twelfth transistor being connected to the third node, a first pole of the twelfth transistor being connected to the signal output terminal, a second pole of the twelfth transistor being connected to the low level signal input terminal, and wherein in the third phase, the high level signal inputted by the reset signal input terminal controls the fifth transistor to be turned on, the low level signal inputted by the low level signal input terminal is transmitted to the first node, the sixth transistor and the seventh transistor are turned off;

the high level signal inputted by the high level signal input terminal controls the eighth transistor and the ninth transistor to be turned on, the high level signal inputted by the high level signal input terminal is transmitted to the third node; the third node controls the eleventh transistor to be turned on, the low level signal inputted by the low level signal input terminal is transmitted to the second node, the second node discharges the capacitor; the third node controls the twelfth transistor to be turned on, the low level signal inputted by the low level signal input terminal is transmitted to the signal output terminal.

\* \* \* \* \*